United States Patent
Ingalls et al.

(10) Patent No.: US 10,095,282 B2
(45) Date of Patent: Oct. 9, 2018

(54) COVER FOR HEAT SINK

(71) Applicant: DELL PRODUCTS, LP, Round Rock, TX (US)

(72) Inventors: Andrew O. Ingalls, Round Rock, TX (US); Neda Abdul-Razzak, Pflugerville, TX (US); Edward D. Geist, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 152 days.

(21) Appl. No.: 15/191,349

(22) Filed: Jun. 23, 2016

(65) Prior Publication Data

US 2017/0371384 A1   Dec. 28, 2017

(51) Int. Cl.
| | |
|---|---|
| *H05K 7/20* | (2006.01) |
| *G06F 1/20* | (2006.01) |
| *F28F 9/00* | (2006.01) |
| *F28D 21/00* | (2006.01) |

(52) U.S. Cl.
CPC ............... *G06F 1/20* (2013.01); *F28D 21/00* (2013.01); *F28F 9/001* (2013.01); *H05K 7/2039* (2013.01); *H05K 7/20136* (2013.01); *F28D 2021/0029* (2013.01); *F28F 2250/08* (2013.01); *F28F 2275/20* (2013.01); *F28F 2280/04* (2013.01)

(58) Field of Classification Search
None
See application file for complete search history.

(56) References Cited

U.S. PATENT DOCUMENTS

| | | | | |
|---|---|---|---|---|
| 5,630,469 A | * | 5/1997 | Butterbaugh | ....... H01L 23/4006 165/122 |
| 5,738,531 A | * | 4/1998 | Beaman | ............... G01R 1/0483 257/E23.067 |
| 6,086,387 A | | 7/2000 | Gallagher et al. | |
| 6,667,884 B1 | | 12/2003 | Lee et al. | |
| 6,741,470 B2 | * | 5/2004 | Isenburg | ............. H01L 23/4093 165/80.3 |
| 6,924,982 B2 | * | 8/2005 | Chen | ................... H01L 23/4093 165/185 |

(Continued)

*Primary Examiner* — Sherman Ng
*Assistant Examiner* — Matt Dhillon
(74) *Attorney, Agent, or Firm* — Larson Newman, LLP

(57) ABSTRACT

A processor can be damaged by a heat sink. If the heat sink is improperly installed, the heat sink may damage the processor and/or the motherboard. Sequential tightening of mechanical fasteners is thus recommended, but the sequential tightening is challenging to implement. Sequential tightening of fasteners helps reduce damage to a processor. When a heat sink is fastened over the processor to a motherboard, mechanical fasteners are tightened in a sequence to reduce damage to the processor. To ensure sequential tightening of the mechanical fasteners, the heat sink is first secured with only two of the mechanical fasteners preinstalled in two of four holes in the heat sink and sequentially tightened into a bolster plate on a bottom side of the motherboard. A cover is then installed over the heat sink, and the cover has two mechanical fasteners that align with a remaining two of the four holes in the heat sink. A remaining two of the mechanical fasteners may then be sequentially tightened into the bolster plate.

16 Claims, 8 Drawing Sheets

(56) References Cited

U.S. PATENT DOCUMENTS

| | | | | |
|---|---|---|---|---|
| 7,126,823 B2* | 10/2006 | Chen | ............... | H01L 23/4093 |
| | | | | 361/702 |
| 7,397,663 B2* | 7/2008 | Chen | ............... | H01L 23/4093 |
| | | | | 165/80.3 |
| 7,558,066 B2* | 7/2009 | Eckberg | ............ | H01L 23/4006 |
| | | | | 165/104.33 |
| 7,566,237 B2* | 7/2009 | Gattuso | ............ | H01L 23/4093 |
| | | | | 439/331 |
| 7,576,989 B2* | 8/2009 | Li | ............ | H01L 23/4093 |
| | | | | 165/185 |
| 7,647,960 B2* | 1/2010 | Peng | ............. | H01L 23/3672 |
| | | | | 165/121 |
| 7,944,698 B2* | 5/2011 | Colbert | ........... | H01L 23/4006 |
| | | | | 165/104.33 |
| 2004/0252462 A1* | 12/2004 | Cromwell | ........ | H01L 23/4093 |
| | | | | 361/719 |
| 2013/0088865 A1 | 4/2013 | Guercio et al. | | |
| 2017/0117652 A1* | 4/2017 | Hachuda | ............ | H01R 13/11 |

* cited by examiner

COVER FOR HEAT SINK

FIELD OF THE DISCLOSURE

The present disclosure generally relates to information handling systems, and more particularly relates to a cover of a heat sink for an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A processor can be damaged by a heat sink. If the heat sink is improperly installed, the heat sink may damage the processor and/or the motherboard. Sequential tightening of mechanical fasteners is thus recommended, but the sequential tightening is challenging to implement.

Sequential tightening of fasteners helps reduce damage to a processor. When a heat sink is secured over the processor to a motherboard, mechanical fasteners are tightened in a sequence to reduce damage to the processor. A cover is added to the heat sink to ensure sequential tightening of the mechanical fasteners. The heat sink is first secured with only two mechanical fasteners, as specified by a sequence. These two mechanical fasteners are sequentially tightened into a bolster plate on a bottom side of the motherboard. The cover is next installed over the heat sink, and the cover has two additional mechanical fasteners that align with remaining holes in the heat sink. The two additional mechanical fasteners may then be sequentially tightened into the bolster plate, again according to the sequence. By installing the cover over the heat sink, a machine or human installer is forced to adhere to the sequential tightening of the mechanical fasteners into the bolster plate.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
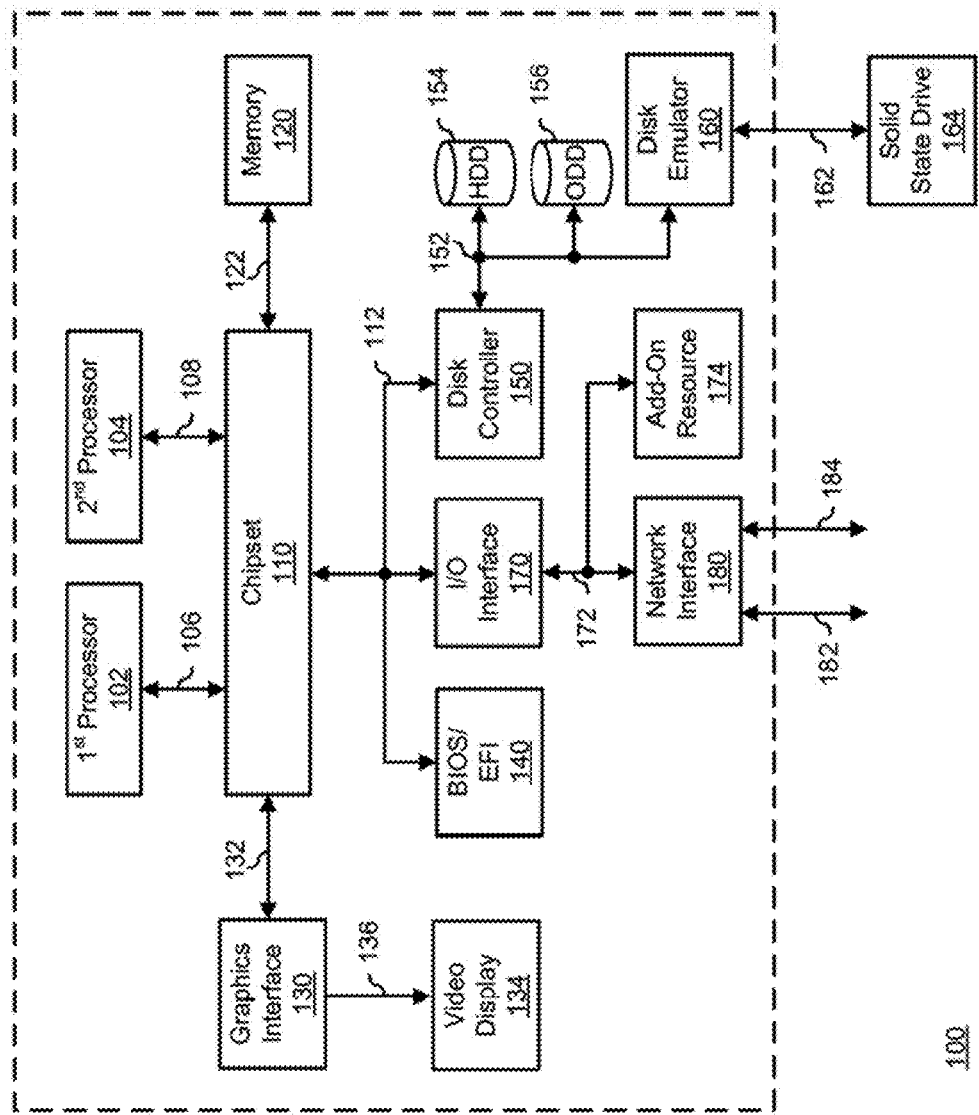
FIG. 1 is a block diagram illustrating an information handling system according to an embodiment of the present disclosure.

FIG. 1 illustrates a generalized embodiment of an information handling system 100, according to exemplary embodiments. For purpose of this disclosure the information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, include a basic input and output system/extensible firmware interface (BIOS/EFI)

module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources.

Disk controller 150 includes a disk interface 152 that connects the disc controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
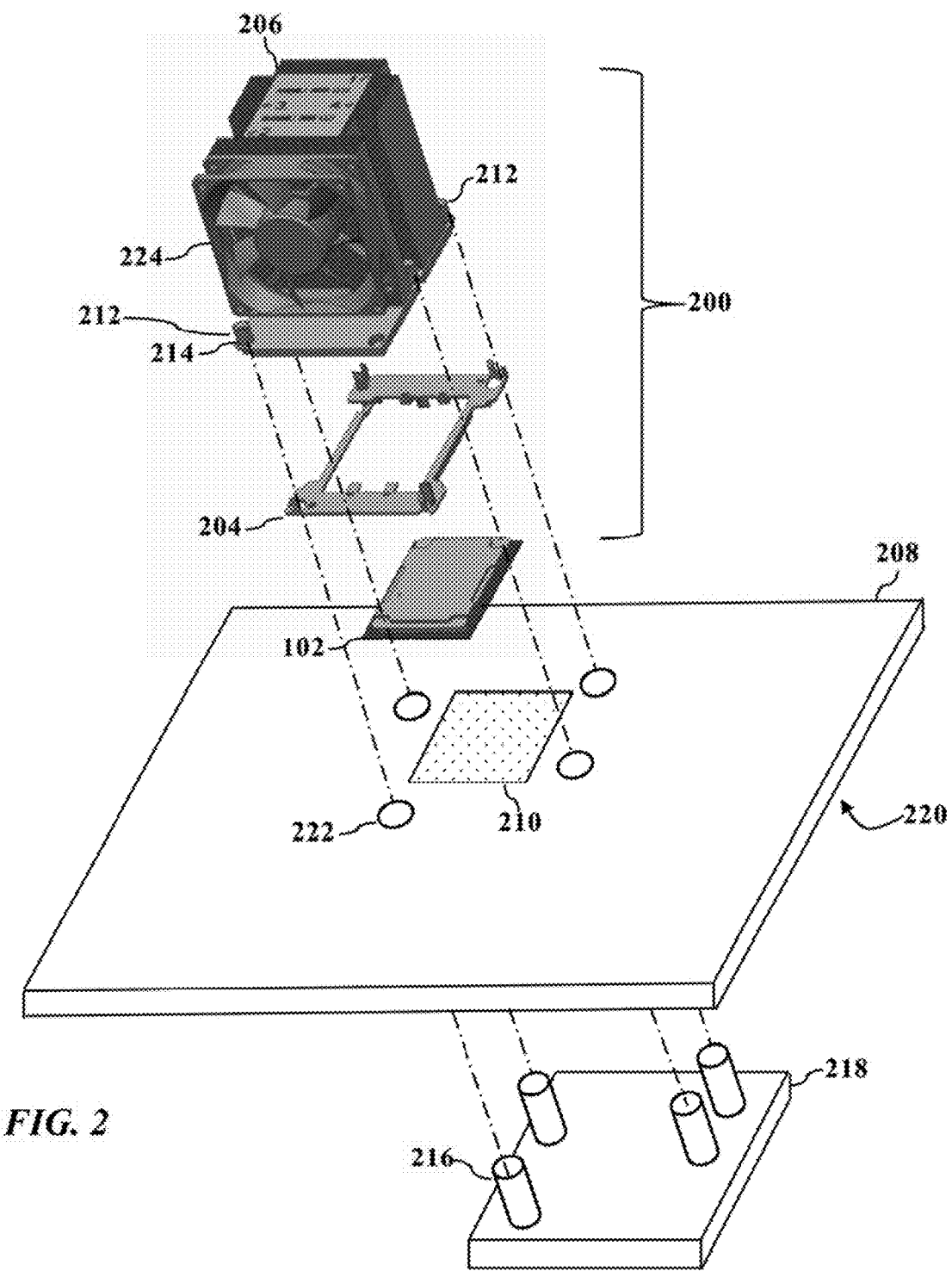
FIGS. 2-3 illustrate a processor module, according to exemplary embodiments.
Figure 3:
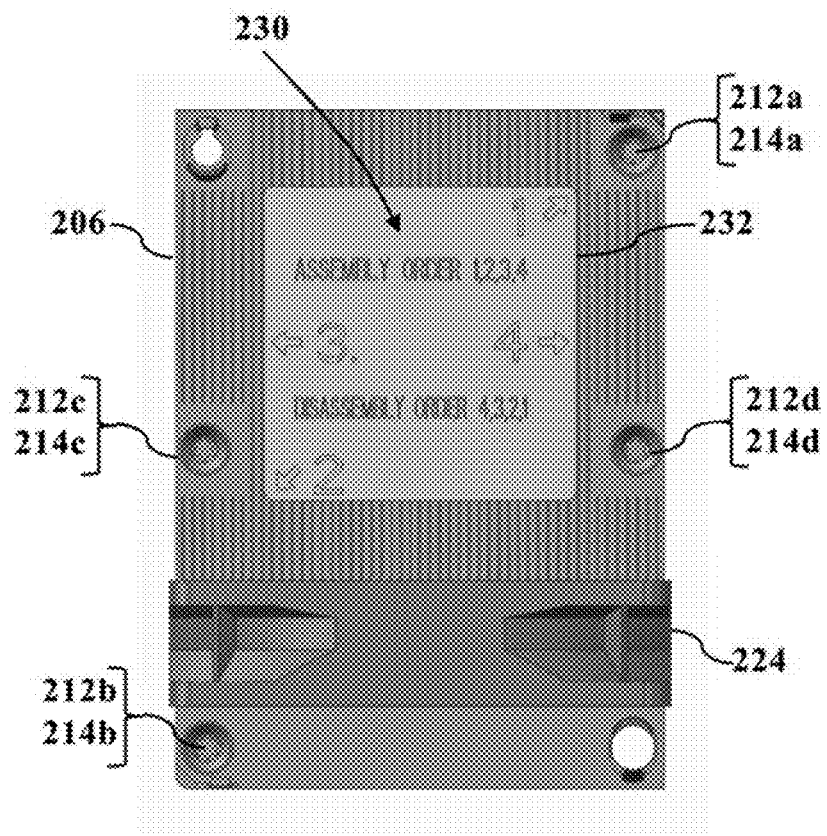

FIGS. 2-3 illustrate a processor module 200, according to exemplary embodiments. FIG. 2 illustrates an exploded view of the module 200, while FIG. 3 illustrates a top view of the module 200. The processor 102 (or 104, as illustrated in FIG. 1) snaps into or otherwise attaches to a spring-loaded processor clip 204. The processor clip 204 snaps onto or otherwise attaches to a heat sink 206, thus forming the module 200. The module 200 then attaches to a motherboard (generically shown as reference numeral 208). As those of ordinary skill in the art understand, the processor 102 has pins (not shown for simplicity) that insert into a mating socket 210 in the motherboard 208. Once the pins are properly aligned to the socket 210, mechanical fasteners 212 (such as screws or bolts) compress the electrical connection, thus socketing the processor 102 to the socket 210. FIG. 2 illustrates the mechanical fasteners 212 preinstalled in the heat sink 206, thus reducing labor time and assembly complexity. However, the mechanical fasteners 212 may be separately inserted for installation. Regardless, the mechanical fasteners 212 insert through body holes 214 in the heat sink 206 (and perhaps also through the processor clip 204) and thread into aligned tapped holes 216 in a bolster plate 218. The bolster plate 218 may thus attach to a bottom or under side 220 of the motherboard 208, and the tapped holes 214 may insert up through openings 222 in the motherboard 208. As the mechanical fasteners 212 are turned and tightened into their respective tapped holes 216, the mechanical fasteners 212 compress the pins of the processor 102 into the mating socket 210, as is known. A cooling fan 224 may then attach to the heat sink 206.

FIG. 3 illustrates a top view of the module 200. As the reader may understand, a manufacturer of the processor 102 recommends a particular sequence 230 when tightening the mechanical fasteners 212. An adhesive label 232, for example, may be affixed to the heat sink 206, and the adhesive label 232 specifies the sequence 230 when tightening the mechanical fasteners 212a-d. This sequence 230 reduces damage to the processor and to the socket (illustrated as reference numerals 102 and 210 in FIG. 2), and the sequence 230 ensures proper seating of the processor 102 into the socket 210. Factory and service personnel thus need to ensure adherence to the sequence 230; otherwise, higher manufacturing and warranty costs may be incurred and customer experiences may suffer.

Figure 4:
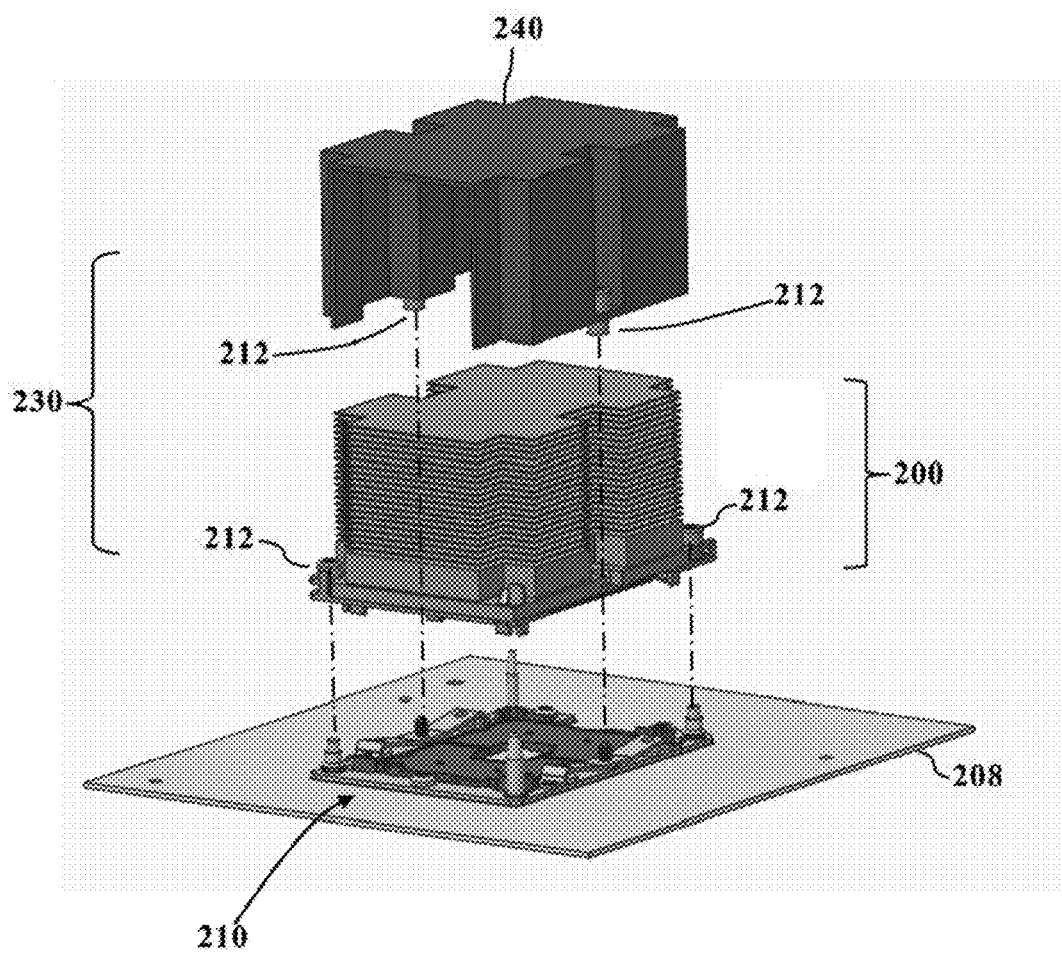
FIGS. 4-6 are perspective views that illustrate logical enforcement of a tightening sequence, according to exemplary embodiments.
Figure 5:
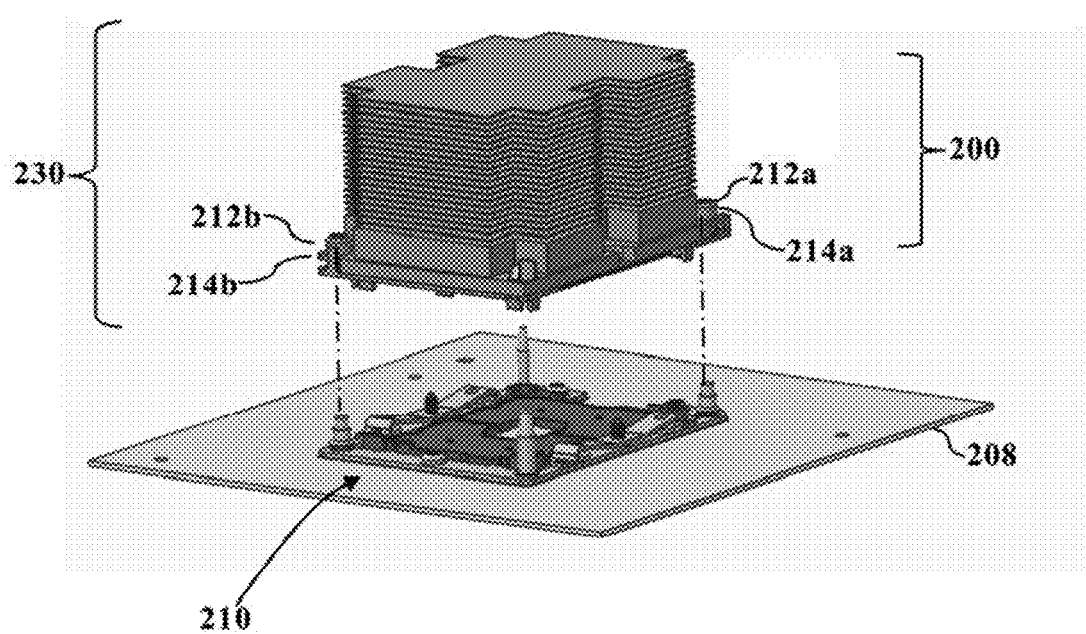
Figure 6:
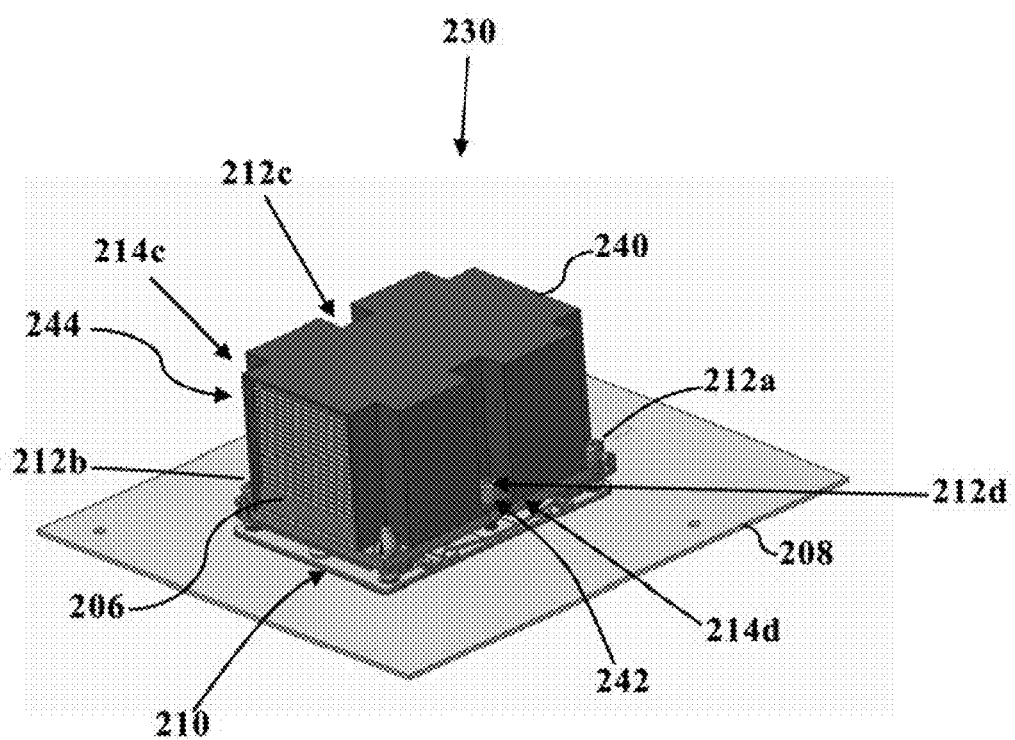

FIGS. 4-6 illustrate logical enforcement of the sequence 230, according to exemplary embodiments. FIG. 4 illustrates a heat sink cover 240 that is installed over the module 200. The heat sink cover 240 logically and procedurally forces a human operator or robotic machine to adhere to the sequence 230 for tightening the mechanical fasteners 212.

For example, as FIG. 5 illustrates, once the module 200 is assembled (as explained with reference to FIG. 2), the module 200 is attached to the socket 210 in the motherboard 208. Two (2) of the mechanical fasteners 212a and 212b are preinstalled into respective body holes #1 and #2 (illustrated, respectively, as reference numerals 214a and 214b). The human operator or machine then begins the sequence 230 with step #1 of applying a rotational torque to the first mechanical fastener 214a, thus at least partially seating the module 200 to the socket 210 (via threaded engagement with the bolster plate 218, as FIG. 2 illustrates). Step #2 next applies the same (or perhaps different) rotational torque to the second mechanical fastener 214b, thus further seating the module 200 to the socket 210 according to the sequence 230.

FIG. 6 illustrates the heat sink cover 240. Once the mechanical fasteners 212a and 212b have been sequentially tightened according to the sequence 230, step #3 instructs the human operator or machine to place the heat sink cover 240 over the heat sink 206. The heat sink cover 240 may only have two holes 242 and 244, and these two holes 242 and 244 may only align with the remaining body holes #3 and #4 (illustrated in FIG. 3 as reference numerals 214c and 214d) in the heat sink 206. Step #4 then instructs the human operator or machine to tighten the remaining two (2) of the mechanical fasteners 212c and 212d, which may be preinstalled in the two holes 242 and 244 in the heat sink cover 240 (and which align with the remaining body holes 214c and 214d in the heat sink 206). Steps #5 and #6 sequentially apply the same (or perhaps different) rotational torque to the mechanical fasteners 212c and 212d, thus further seating the heat sink 206 with the bolster plate 218 according to the sequence 230. Because the heat sink cover 240 is installed over the heat sink 206, exemplary embodiments force the human operator or machine to adhere to the sequence 230 when tightening the mechanical fasteners 212a-d to the bolster plate.

Figure 7:
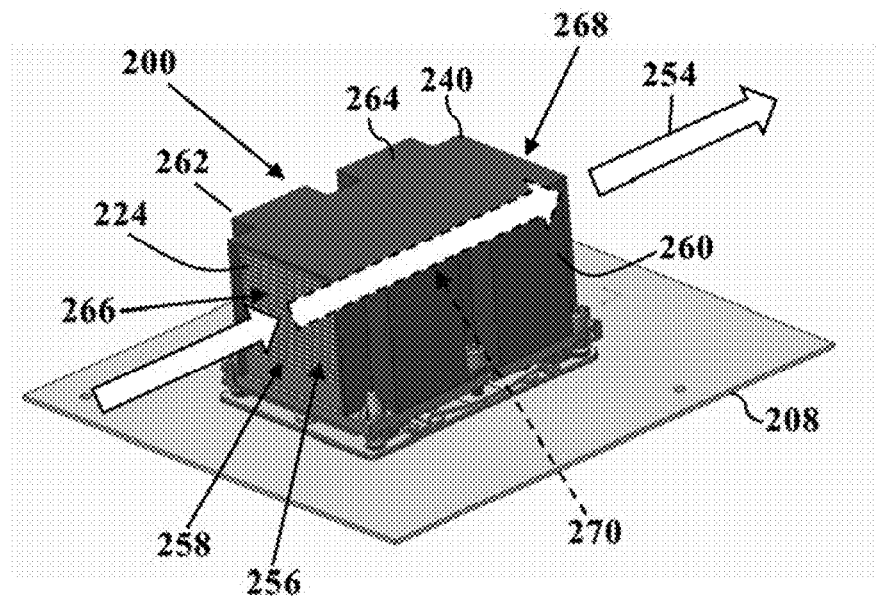
FIG. 7 is a perspective view that illustrates active cooling, according to exemplary embodiments.
Figure 7:
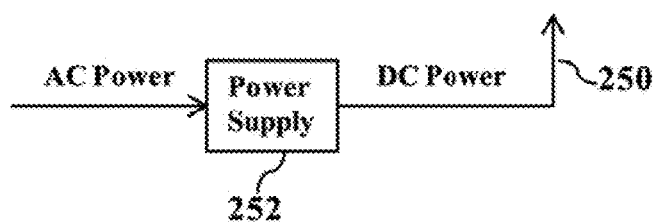

FIG. 7 illustrates active cooling, according to exemplary embodiments. Once the module 200 is attached to the motherboard 208, the heat sink cover 240 also helps cool the processor (illustrated as reference numeral 102 in FIGS. 1-2). When electrical power 250 is supplied via a power supply 252, the processor 102 operates and generates excessive waste heat. The electrical power 250 causes the cooling fan 224 to spin, thus moving ambient air 254 that convectively cools the processor 104. Here, though, the heat sink cover 240 also directionally channels the moving ambient air 254 into, through, and across cooling fins 256 that outwardly project from a body 258 of the heat sink 206. The heat sink cover 240 has generally solid sides 260, 262 and a top 264 that may substantially enclose the heat sink 206. However, the heat sink cover 240 has opposite open ends 266 and 268. The open ends 266 and 268 are in air flow communication with the cooling fan 224, thus forming a unidirectional, internal air flow duct or channel 270 for the forced ambient air 254. The ambient air 254 is thus drawn and pushed into the open end 266 as an entrance to the duct 270. As the moving ambient air 254 is confined within heat sink cover 240, the ambient air 254 unidirectionally flows across the fins 256 to remove waste heat. Heated ambient air 254 thus exits the duct 270 at the opposite open end 268 for removal via a convective cooling effect. The heat sink 206 and the heat sink cover 240 thus functionally operate as a two-piece component for cooling the processor 102.

The heat sink cover 240 may have any size and shape. The sides 260, 262 and the top 264 may have any shape and size to install over the module 200, the heat sink 206, and/or the cooling fan 224. While the heat sink cover 240 may be constructed of any material, the heat sink cover 240 may be molded from any plastic or resin material to reduce costs. However, a designer may prefer to have the heat sink cover 240 constructed or shaped in a metallic material for electromagnetic shielding of the underlying processor 102. The heat sink cover 240 thus has one or more outer surfaces and one or more inner surfaces that are separated by a material thickness.

Figure 8:
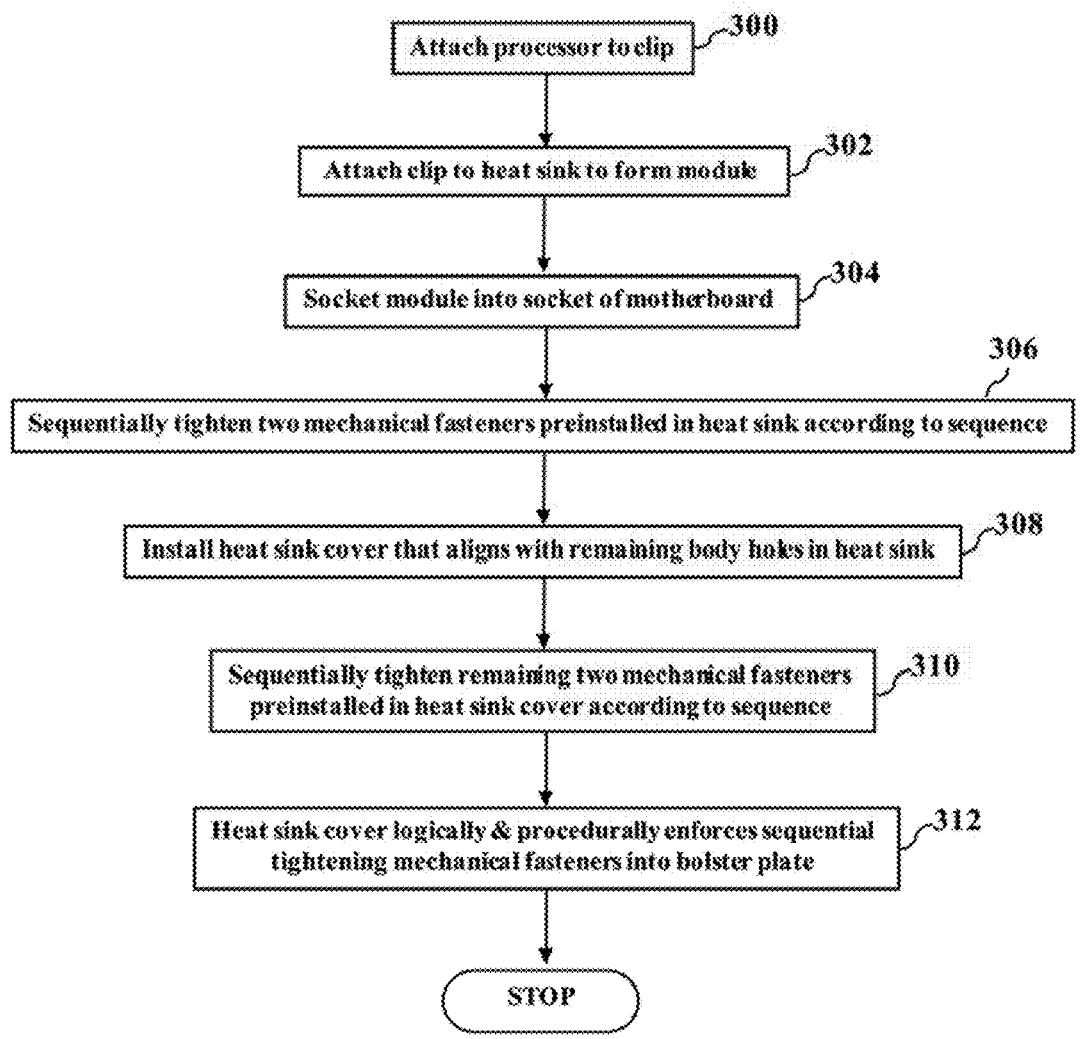
FIG. 8 is a flow chart illustrating a method for sequential adherence, according to exemplary embodiments.

FIG. 8 shows a method for sequential adherence, according to exemplary embodiments. The processor 102 is attached to the processor clip (Block 300). The processor clip 204 is attached to the heat sink 206 to form the module 200 (Block 302). The module 200 is socketed to the socket 210 of the motherboard 208 (Block 304). Two of the mechanical fasteners 212a and 212b are preinstalled in the heat sink 206 for threaded engagement with the bolster plate 218 and sequentially tightened according to the sequence 230 (Block 306). The heat sink cover 240 is then overlaid onto the heat sink 206 (Block 308) and aligned with the remaining body holes 214c and 214d in the heat sink 206. The remaining two preinstalled mechanical fasteners 212c and 212d threadably engage the bolster plate 218 and are sequentially tightened according to the sequence 230 (Block 310), thus logically and procedurally enforcing sequential tightening of the mechanical fasteners 212 into the bolster plate 218 (Block 312).

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (such as random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A heat sink, comprising:
a body having cooling fins projecting therefrom, the body of the heat sink for cooling a processor electrically coupled to a socket of a motherboard, the body of the heat sink having first, second, third, and fourth body holes for sequential tightening of corresponding mechanical fasteners that align with holes in a bolster plate on a bottom side of the motherboard; and
a heat sink cover for installation over at least a portion of the body of the heat sink, the heat sink cover having only two holes that align with only two of the body holes in the body;
wherein the heat sink cover enforces the sequential tightening of the corresponding mechanical fasteners into the holes in the bolster plate via the two holes.

2. The heat sink of claim 1, further comprising a fan for convecting air across the body of the heat sink.

3. The heat sink of claim 1, further comprising an open end in the heat sink cover, the open end for convecting air along the cooling fins projecting from the body of the heat sink.

4. The heat sink of claim 1, further comprising open ends in the heat sink cover, the open ends for convecting air along the cooling fins projecting from the body of the heat sink.

5. The heat sink of claim 1, further comprising a processor clip that retains the processor to the body of the heat sink.

6. A method comprising:
attaching a processor to a processor clip;
attaching the processor clip to a heat sink, the heat sink having cooling fins projecting therefrom, and the heat sink having first, second, third, and fourth body holes for sequential tightening of four mechanical fasteners;
socketing the processor into a socket of a motherboard;
inserting two of the four mechanical fasteners through two of the body holes in the heat sink and through two clip holes in the processor clip;
sequentially tightening the two of the four mechanical fasteners into a bolster plate on a bottom side of the motherboard, with the bolster plate having two threaded holes that respectively engage the two of the four mechanical fasteners when inserted through the two of the body holes in the heat sink;
installing a heat sink cover over at least a portion of the heat sink, the heat sink cover having only two holes that only align with a remaining two of the body holes in the heat sink;
inserting a remaining two of the four mechanical fasteners through the two holes in the heat sink cover, through the remaining two of the body holes in the heat sink, and through another two clip holes in the processor clip; and
sequentially tightening the remaining two of the four mechanical fasteners into a remaining two threaded holes in the bolster plate on the bottom side of the motherboard, such that
the heat sink cover enforces the sequential tightening of the four mechanical fasteners into the bolster plate.

7. The method of claim 6, further comprising attaching a cooling fan to the heat sink.

8. The method of claim 6, further comprising supplying electrical power to the processor.

9. The method of claim 8, further comprising supplying the electrical power to a cooling fan.

10. The method of claim 9, further comprising convecting air across the heat sink to remove waste heat generated by the processor.

11. The method of claim 9, further comprising convecting air within the heat sink cover to remove waste heat generated by the processor.

12. The method of claim 9, further comprising convecting air between open ends of the heat sink cover to remove waste heat generated by the processor.

13. An information handling system, comprising:
a processor socketed into a socket of a motherboard;
a heat sink installed over the processor via a processor clip, the heat sink having cooling fins projecting therefrom, and the heat sink having four body holes for sequential tightening of four mechanical fasteners;
two of the four mechanical fasteners inserted through two of the four body holes in the heat sink and through two clip holes in the processor clip, the two of the four mechanical fasteners sequentially tightened into corresponding threaded holes in a bolster plate on a bottom side of the motherboard;
a heat sink cover installed over at least a portion of the heat sink, the heat sink cover only having two holes that only align with a remaining two of the four body holes in the heat sink; and
a remaining two of the four mechanical fasteners inserted through the two holes in the heat sink cover, through the remaining two of the four body holes in the heat sink, and through another two clip holes in the processor clip, the remaining two of the four mechanical fasteners sequentially tightened into remaining ones of the threaded holes in the bolster plate on the bottom side of the motherboard;
wherein the heat sink cover enforces the sequential tightening of the mechanical fasteners into the bolster plate.

14. The information handling system of claim 13, further comprising a power supply for supplying electrical power to the processor.

15. The information handling system of claim 13, further comprising a cooling fan attached to the heat sink.

16. The information handling system of claim 15, further comprising a power supply for supplying electrical power to the cooling fan.

\* \* \* \* \*